(12) United States Patent
Lee

(10) Patent No.: US 7,831,845 B2
(45) Date of Patent: Nov. 9, 2010

(54) POWER-UP CIRCUIT AND SEMICONDUCTOR MEMORY APPARATUS WITH THE SAME

(75) Inventor: Ihl-Ho Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1035 days.

(21) Appl. No.: 11/594,855

(22) Filed: Nov. 9, 2006

(65) Prior Publication Data

US 2007/0150770 A1    Jun. 28, 2007

(30) Foreign Application Priority Data

Dec. 28, 2005  (KR)  ...................... 10-2005-0131391

(51) Int. Cl.
*G06F 1/00*     (2006.01)
*G06F 1/26*     (2006.01)
*G06F 5/14*     (2006.01)

(52) U.S. Cl. .................. 713/300; 713/320; 713/500; 365/226; 327/143

(58) Field of Classification Search ................ 713/300, 713/320, 500; 365/226; 327/143, 545
See application file for complete search history.

(56) References Cited

U.S. PATENT DOCUMENTS

| 5,510,741 | A | 4/1996 | Childs |
| 5,898,635 | A | 4/1999 | Raad et al. |
| 6,720,808 | B1 | 4/2004 | Chan |
| 6,731,143 | B2 | 5/2004 | Kim |
| 6,731,562 | B2 | 5/2004 | Roohparvar |
| 6,937,074 | B2 | 8/2005 | Shin |
| 7,504,748 | B2 * | 3/2009 | Chang et al. ................ 307/126 |
| 2007/0079147 | A1 * | 4/2007 | Pyeon et al. ................ 713/300 |

FOREIGN PATENT DOCUMENTS

JP    2005196929 A    7/2005

* cited by examiner

*Primary Examiner*—Mark Connolly
(74) *Attorney, Agent, or Firm*—Venable LLP; Jeffri A. Kaminski

(57) ABSTRACT

A power-up circuit includes a power-up signal generating section connected to an external source terminal, configured to generate a power-up signal when the external source reaches a predetermined target level, and to selectively interrupt a path from the external source terminal in response to a selection signal. A pulse generating section generates a pulse with a predetermined pulse width to control an initializing operation with reference to an activation time of the power-up signal. A power-up controlling section provides the power-up signal generating section with the selection signal, variable by the pulse, when the power-up signal is active.

29 Claims, 10 Drawing Sheets

US 7,831,845 B2

POWER-UP CIRCUIT AND SEMICONDUCTOR MEMORY APPARATUS WITH THE SAME

CROSS-REFERENCE TO RELATED APPLICATIONS

This U.S. non-provisional patent application claims priority under 35 U.S.C. §119 of Korean Patent Application No. 2005-131391 filed on Dec. 28, 2005, the entire contents of which are hereby incorporated by reference.

BACKGROUND

The present invention described herein relates to technology for power-up control in semiconductor memory apparatuses. In particular, the present invention described herein relates to a technique capable of reducing current consumption during a power-up operation, suitable for a low-power DRAM.

Most semiconductor memory apparatuses, especially, DRAMs, usually use basic settings or initializing operations necessary for chip operations before or after stabilizing power supplies from external power sources. Specifically, it is necessary to control the voltage level of a latch circuit or specific node connected to an input buffer in a DRAM. Further, a chip designer is also required to set the voltage level of the latch circuit or specific node at a level with options. This operation is generally accomplished by a power-up circuit, which is generally employed in a DRAM.

The power-up circuit is also used to determine the time to generate an internal voltage in a DRAM chip. In other words, the power-up circuit generates a specific signal when an external power source voltage rises up to a target voltage level, outputting an internal voltage with reference to the point of the specific signal. For instance, if the external power source voltage is 2.5V, the specific signal is generated when the external power source voltage arrives around 1.2V.

With respect to these facts, FIG. 1 shows a conventional power-up circuit.

As illustrated in FIG. 1, the conventional power-up circuit includes a power-up signal generating section 10, a pulse generating section 20, and an initializing section 30.

The power-up signal generator 10 receives an external power source voltage VDD and a ground voltage VSS and provides the initializing section 30 with a power-up signal PWRUP that is set when the external power source voltage VDD reaches a specific voltage (i.e., a target voltage). The power-up signal generating section 10 also outputs an inverted power-up signal PWRUPB to the pulse generating section 20.

The pulse generating section 20 provides the initializing section 30 with a short pulse PWRUP_P with reference to a point at which the inverted power-up signal PWRUPB is supplied from the power-up signal generating section 10. The initializing section 30 initializes the internal circuits of the semiconductor memory apparatus in accordance with the power-up signal PWRUP of the power-up signal generating section 10 and the pulse PWRUP_P of the pulse generating section 20.

Especially, the initializing section 30 initializes the part where PMOS and NMOS transistors forming a CMOS circuit are turned on at the same time during the short period of the pulse PWRUP_P. Namely, the pulse generating section 20 provides the pulse PWRUP_P in order to mostly reduce the consumption of a direct current through the PMOS and NMOS transistors that are turned on at the same time.

FIG. 2 is a detailed circuit diagram of the power-up signal generating section 10 shown in FIG. 1.

The power-up signal generating section 10 includes a plurality of PMOS transistors P1~P5, a plurality of NMOS transistors N1~N6, resistors R1~R4, and a plurality of inverters IV1~IV4.

A voltage divider 11 includes the resistors R1~R4 serially connected to each other, the PMOS transistor P1 coupled to the ground voltage VSS through its gate, and the NMOS transistor N1 coupled to the external power source voltage VDD through its gate. The voltage divider 11 divides the external power source voltage VDD by the resistors R1~R4 and provides a node A with a specific level among divided voltages. An output from the node A is applied to the gate terminal of the NMOS transistor N2 and the serially connected NMOS transistors N3~N6, thereby outputting a detection signal DET through the drain terminal of the NMOS transistor N3.

As the voltage divider 11 is designed with a very large resistance so as to restrain current consumption, charges output to the node A may be sensitive to a coupling effect. Therefore, the NMOS transistor N2 contributes to prevent a coupling effect at the node A.

A latch composed of the inverters IV1 and IV2 latches and outputs the detection signal DET. The inverter IV3 logically inverts the output of the latch and outputs the inverted power-up signal PWRUPB, while the inverter IV4 logically inverts the inverted power-up signal PWRUPB and outputs the power-up signal PWRUP.

FIG. 3 is a detailed circuit diagram of the pulse generating section 20 shown in FIG. 1.

The pulse generating section 20 is composed of a delayer 21, inverters IV5 and IV6, and a NAND gate ND1, which is a general, well known circuit pattern. The delayer 21 outputs the inverted power-up signal PWRUPB with a predetermined delay time. The inverter IV5 logically inverts the output of the delayer 21 and outputs the inverted output to the node B. The NAND gate ND1 conducts a NAND operation on the output of the node B and the inverted power-up signal PWRUPB. The inverter IV6 logically inverts the output of the NAND gate ND1 and outputs the pulse PWRUP_P.

FIG. 4 is a timing diagram showing an operation of the power-up circuit shown in FIGS. 1 through 3.

As shown in FIGS. 1 through 3, the conventional power-up circuit is configured to make the voltage level of the node A increase or decrease, as the target voltage set by the voltage divider 11 rises or falls along with the external power source voltage VDD. Also, the conventional power-up circuit detects and outputs a falling time of the voltage level at the node A, the detection signal DET with high level, to generate the power-up signal PWRUP. This can be seen from waveforms of the nodes A and B as shown in FIG. 4.

FIG. 5 is a circuit diagram showing another example of the power-up signal generating section 10 shown in FIG. 1.

The power-up signal generating section 10 of FIG. 5 is constructed without the PMOS and NMOS transistors P1 and N1 in the voltage divider 11 of FIG. 2.

As shown in the timing diagram of FIG. 6, the voltage level of the node A, which is an output of the voltage divider, rises directly along with the external power source voltage VDD. And, according to an output of the node A at a target voltage, the voltage level of the detection signal DET is determined by controlling turn-on states of the serially connected NMOS transistors N3~N6. The detection signal DET determines the power-up signal PWRUP.

As shown in the timing diagrams shown in FIGS. 4 and 6, such conventional power-up circuits always dissipate, currents I(VDD1) and I(VDD2) due to an operational characteristic of the voltage divider 11 before and after stabilization of the external power source voltage VDD.

The current dissipation through the voltage divider is a great burden to a memory apparatus, e.g., a memory for mobile use, which needs to be operable at low power. Moreover, it normally causes unnecessary current consumption in a memory apparatus.

SUMMARY OF THE INVENTION

Embodiments of the present invention provide a power-up circuit reducing unnecessary current consumption during a power-up operation in a memory apparatus.

Embodiments of the present invention also provide a power-up circuit suitable for a memory apparatus, e.g., a memory for mobile use, which needs to be operable at low power.

An embodiment of the present invention provides a power-up circuit comprising: a power-up signal generating section connected to a terminal for an external source, configured to generate a power-up signal when the external source reaches a predetermined target level and to selectively interrupt a path from the terminal in response to a selection signal; a pulse generating section configured to generate a pulse with a predetermined pulse width to control an initializing operation based on an activation time of the power-up signal; and a power-up controlling section configured to provide the power-up signal generating section with the selection signal, variable by the pulse, when the power-up signal is active.

Another embodiment of the present invention provides a semiconductor memory apparatus with a power-up circuit comprising: a power-up signal generating section connected to a terminal for an external source, configured to generate a power-up signal when the external source reaches a predetermined target level and to selectively interrupt a path from the external source terminal in response to a selection signal; a pulse generating section configured to generate a pulse with a predetermined pulse width for controlling an initializing operation with reference to an activation time of the power-up signal; a power-up controlling section configured to provide the power-up signal generating section with the selection signal, variable by the pulse, when the power-up signal is active; and an initializing section configured to initialize circuits, in which PMOS and NMOS transistors are initialized at the same time, in response to the pulse.

Still another embodiment of the present invention provides a power-up circuit comprising: a first node having an output; a voltage divider configured to provide the first node with a voltage resistively divided from an external power source voltage and to selectively interrupt an electrical connection to a ground voltage terminal in response to the selection signal; a voltage supplier configured to supply the external power source voltage to the first node in accordance with the output of the first node; a voltage detector configured to output a detection signal in response to the output of the first node; and a power-up signal output circuit configured to generate a power-up signal based on the detection signal.

The power-up circuit may further comprise a power-up controlling section configured to activate the selection signal in response to the power-up signal.

The power-up circuit may further comprise a latch circuit disposed between the voltage detector and the power-up signal output circuit, and configured to latch an output of the voltage detector for a predetermined time.

The voltage divider may comprise: a plurality of resistors connected between the terminal for the external power source voltage and the ground voltage terminal; and a first switch configured to control the connection between the plurality of resistors and the ground voltage terminal in response to the selection signal.

The first switch may comprise a transmission gate configured to selectively control the connection between the plurality of resistors and the ground voltage terminal in response to the selection signal.

The voltage detector may comprise: a plurality of PMOS transistors, serially connected between the terminal for the external power source voltage and an output terminal of the detection signal, having a common gate terminal coupled to the ground voltage; and a plurality of NMOS transistors serially connected between the output terminal of the detection signal and the ground voltage terminal, having a common gate terminal coupled to the output of the first node.

The voltage detector may further comprise a second switch configured to selectively control the connection between the terminal for the external power source voltage and the plurality of PMOS transistors in response to the selection signal.

The voltage detector may further comprise a third switch configured to selectively control the connection between the ground voltage terminal and the plurality of NMOS transistors in response to the selection signal.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
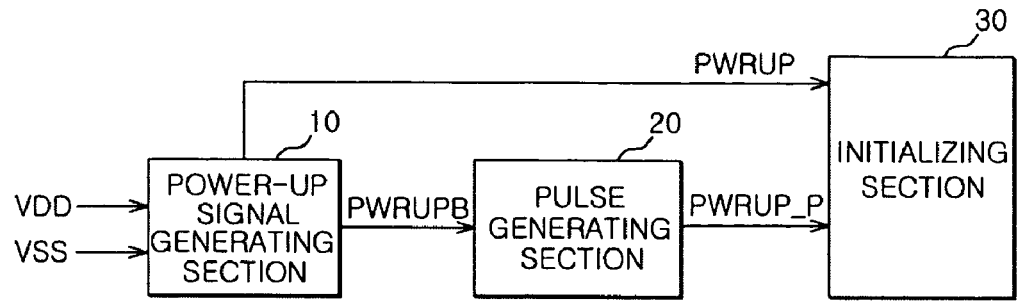
FIG. 1 is a block diagram of a conventional power-up circuit.
Figure 2:
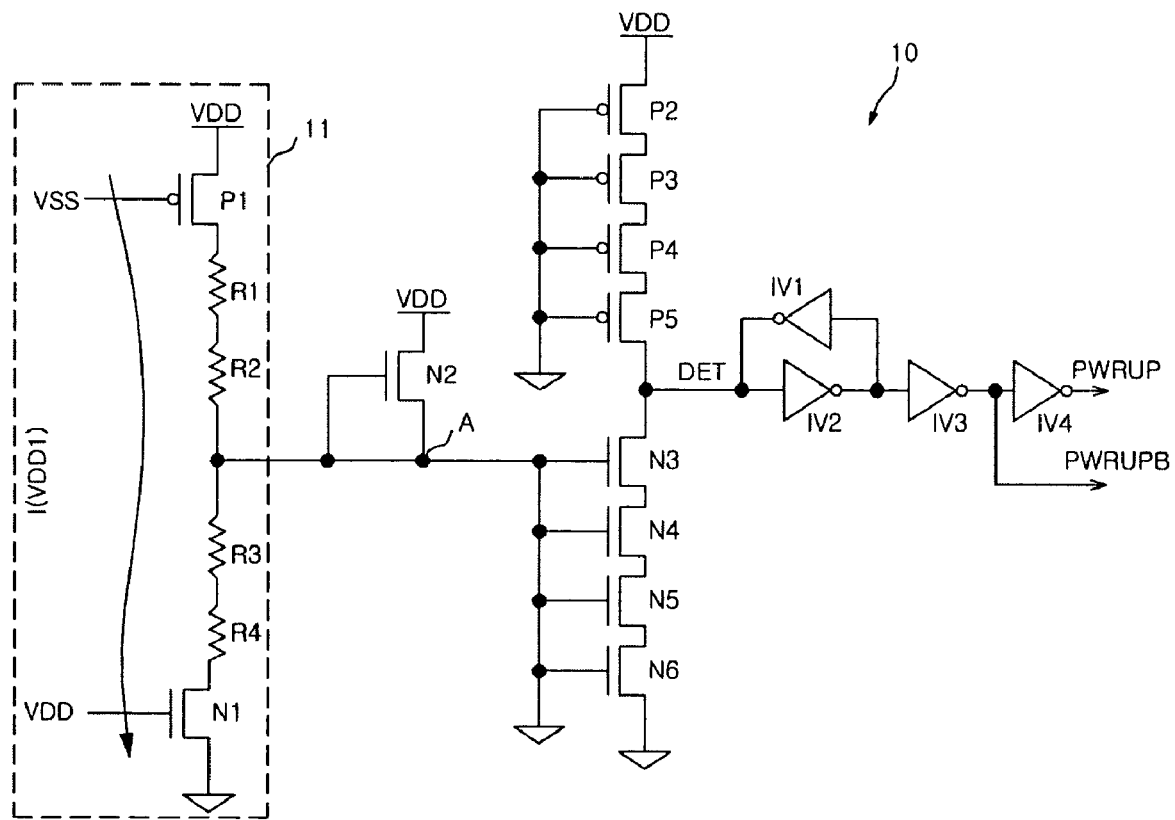
FIG. 2 is a detailed circuit diagram of the power-up signal generating section shown in FIG. 1.

Preferred embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 7:
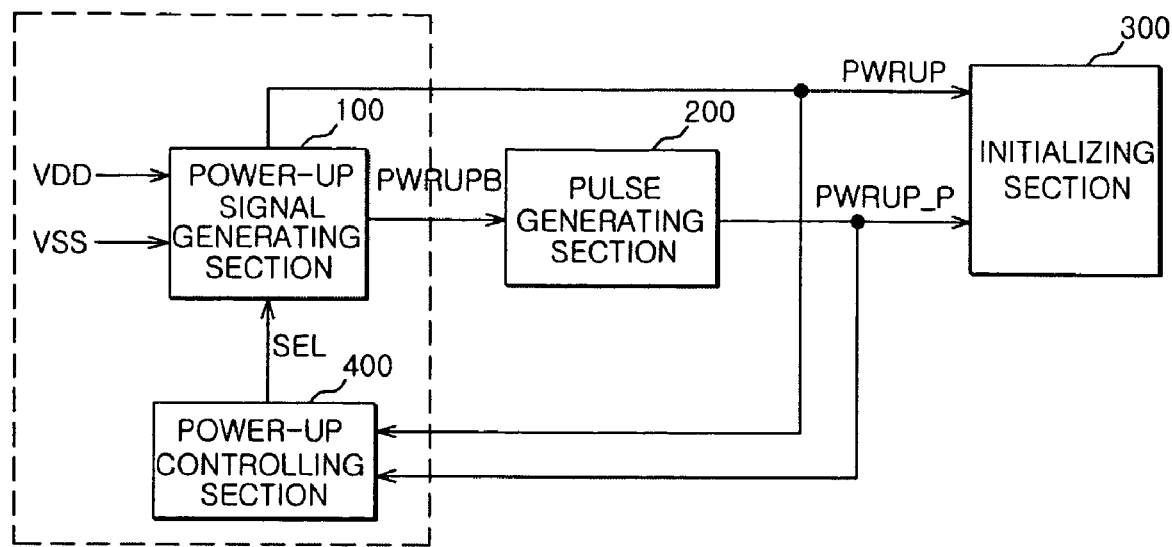
FIG. 7 is a block diagram illustrating a semiconductor memory apparatus including a power-up circuit according to an embodiment of the present invention.

FIG. 7 is a block diagram illustrating a semiconductor memory apparatus including a power-up circuit according to an embodiment of the present invention.

Referring to FIG. 7, the power-up circuit according to an embodiment of the present invention includes a power-up signal generating section 100, a pulse generating section 200, an initializing section 300, and a power-up controlling section 400.

The power-up signal generating section 100 is connected to an external power source voltage VDD terminal and a ground voltage VSS terminal, that generate a power-up signal PWRUP and an inverted power-up signal PWRUPB, respectively when the external power source voltage VDD reaches a target level. The power-up generating section 100 also selectively interrupts current paths of the external power source voltage VDD terminal or the ground voltage VSS terminal in response to a selection signal SEL. That is, the power-up signal generating section 100 provides the initializing section 300 with the power-up signal PWRUP that is set when the external power source voltage VDD reaches a specific voltage (i.e., the target level). The power-up signal generating section 100 also outputs the inverted power-up signal PWRUPB to the pulse generating section 200. The power-up signal generating section 100 also interrupts a current path from the external power source voltage VDD or to the ground voltage VSS in response to the selection signal SEL provided from the power-up controlling section 400.

Figure 3:
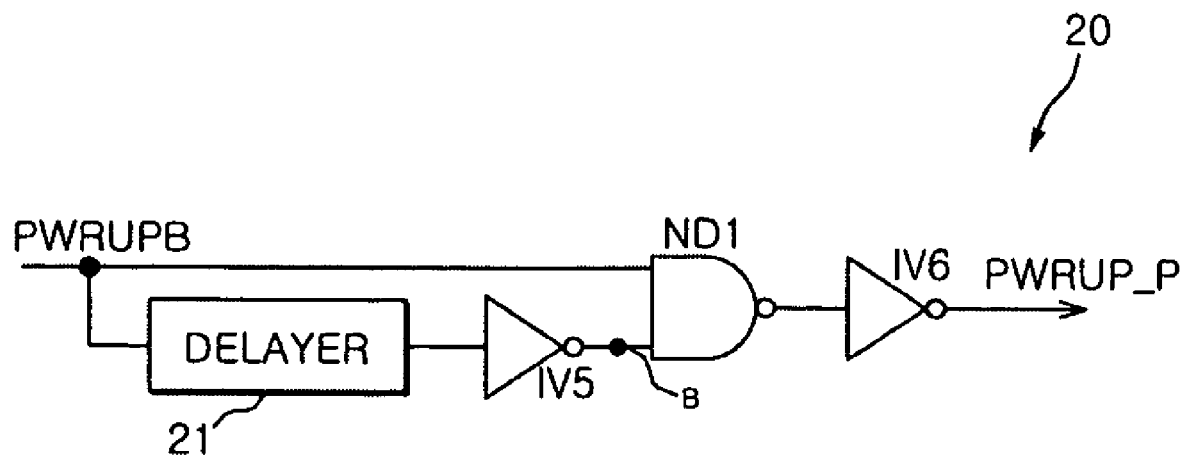
FIG. 3 is a detailed circuit diagram of the pulse generating section shown in FIG. 1.
Figure 4:
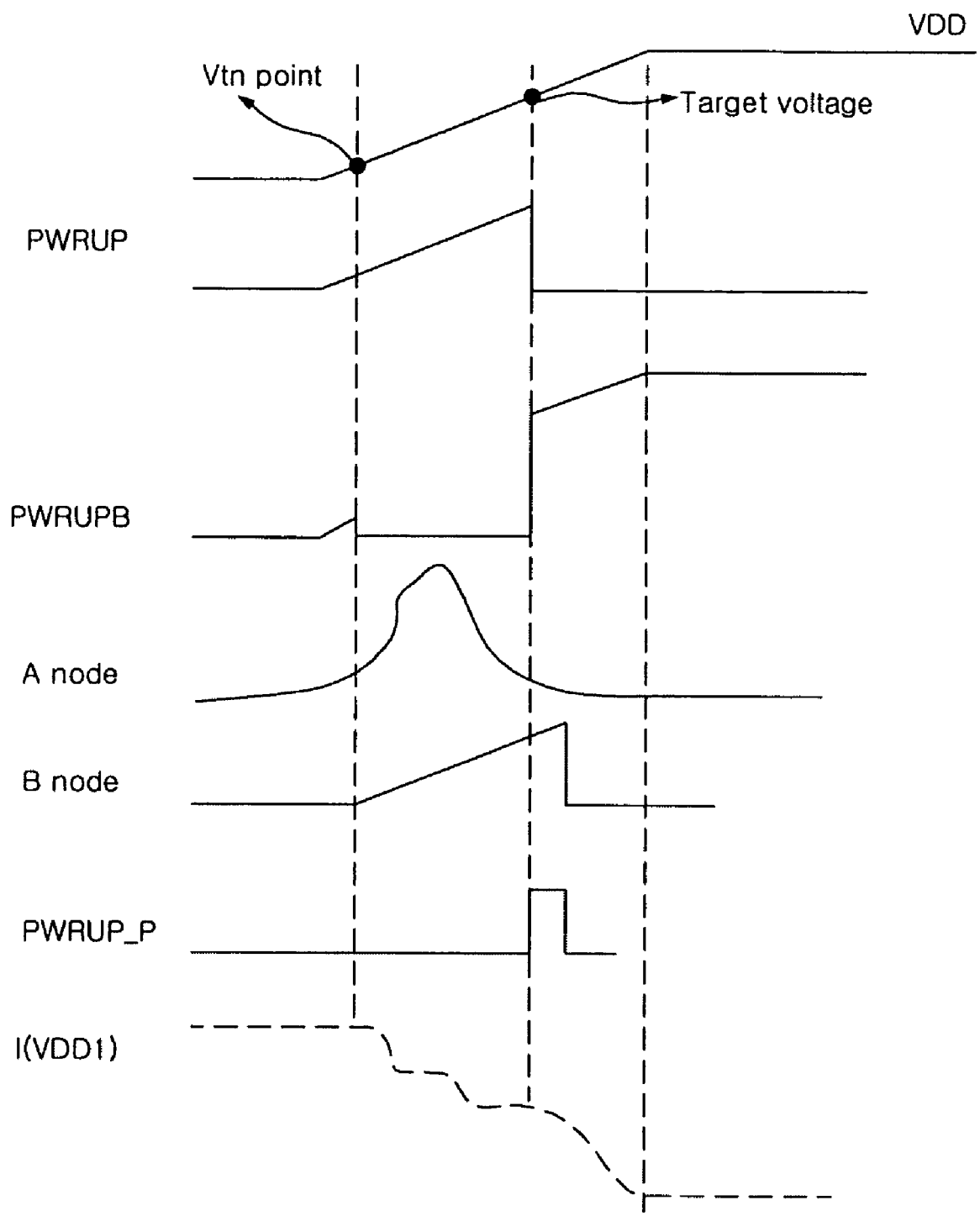
FIG. 4 is a timing diagram showing an operation of the power-up circuit shown in FIG. 1.
Figure 5:
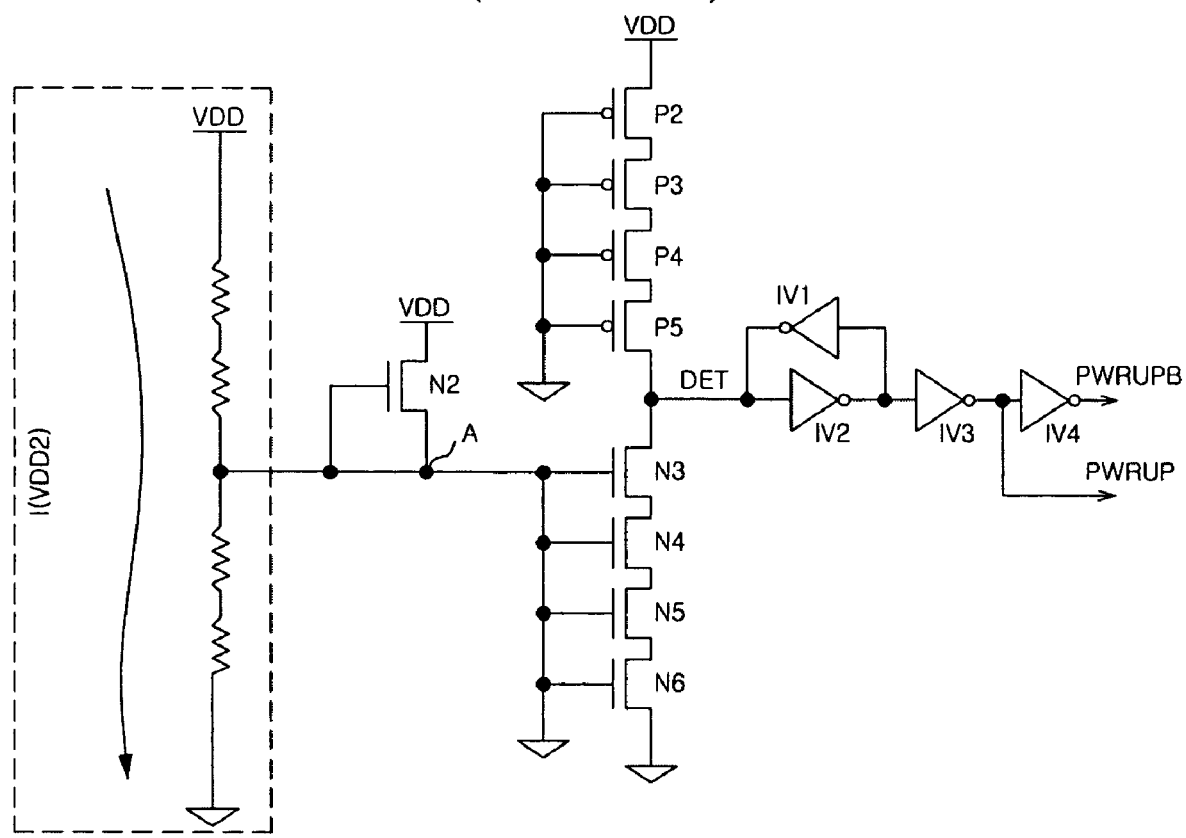
FIG. 5 is a circuit diagram showing another example of the power-up signal generator shown in FIG. 1.
Figure 6:
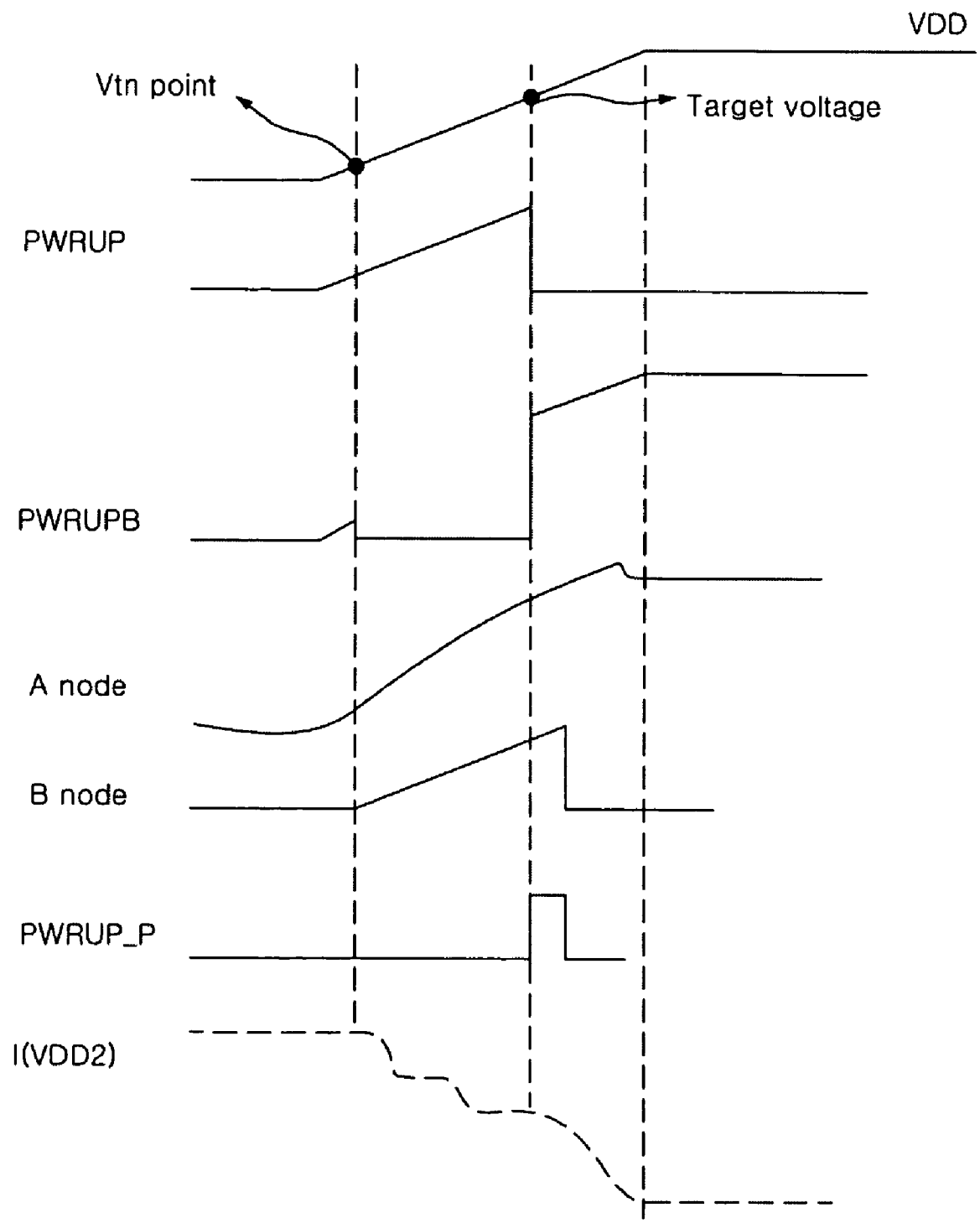
FIG. 6 is a timing diagram showing an operation of the power-up signal generating section shown in FIG. 5.

The pulse generating section 200 generates a pulse PWRUP_P having a predetermined pulse width to regulate an initializing operation with reference to an activation time of the power-up signal. That is, the pulse generating section 200 provides the initializing section 300 with the short pulse PWRUP_P with reference to a point at which the inverted power-up signal PWRUPB is supplied from the power-up signal generating section 100. The pulse generating section 200 may be constructed in the same manner as the circuit shown in FIG. 3.

The initializing section 300 initializes circuits, where PMOS and NMOS transistors are initialized at the same time, in response to the pulse PWRUP_P. The initializing section 300 operates in accordance with inputs of the power-up signal PWRUP and the pulse PWRUP_P. That is, the initializing section 300 initializes the internal circuits of the semiconductor memory apparatus in response to the power-up signal PWRUP of the power-up signal generating section 100 and the pulse PWRUP_P of the pulse generating section 200. The initializing section 300 initializes a part where PMOS and NMOS transistors forming a CMOS circuit are turned on at the same time during the short period of the pulse PWRUP_P. Namely, the pulse generating section 200 provides the pulse PWRUP_P in order to mostly reduce consumption of a direct current through the PMOS and NMOS transistors that are turned on at the same time.

The power-up controlling section 400 provides the power-up signal generating section 100 with the selection signal SEL that varies according to the pulse PWRUP_P while the power-up signal is active. That is, the power-up controlling section 400 outputs the selection signal SEL to selectively interrupt the current path from the external power source voltage VDD or toward the ground voltage VSS in the power-up signal generating section 100 in response to the power-up signal PWRUP and the pulse PWRUP_P.

Figure 8:
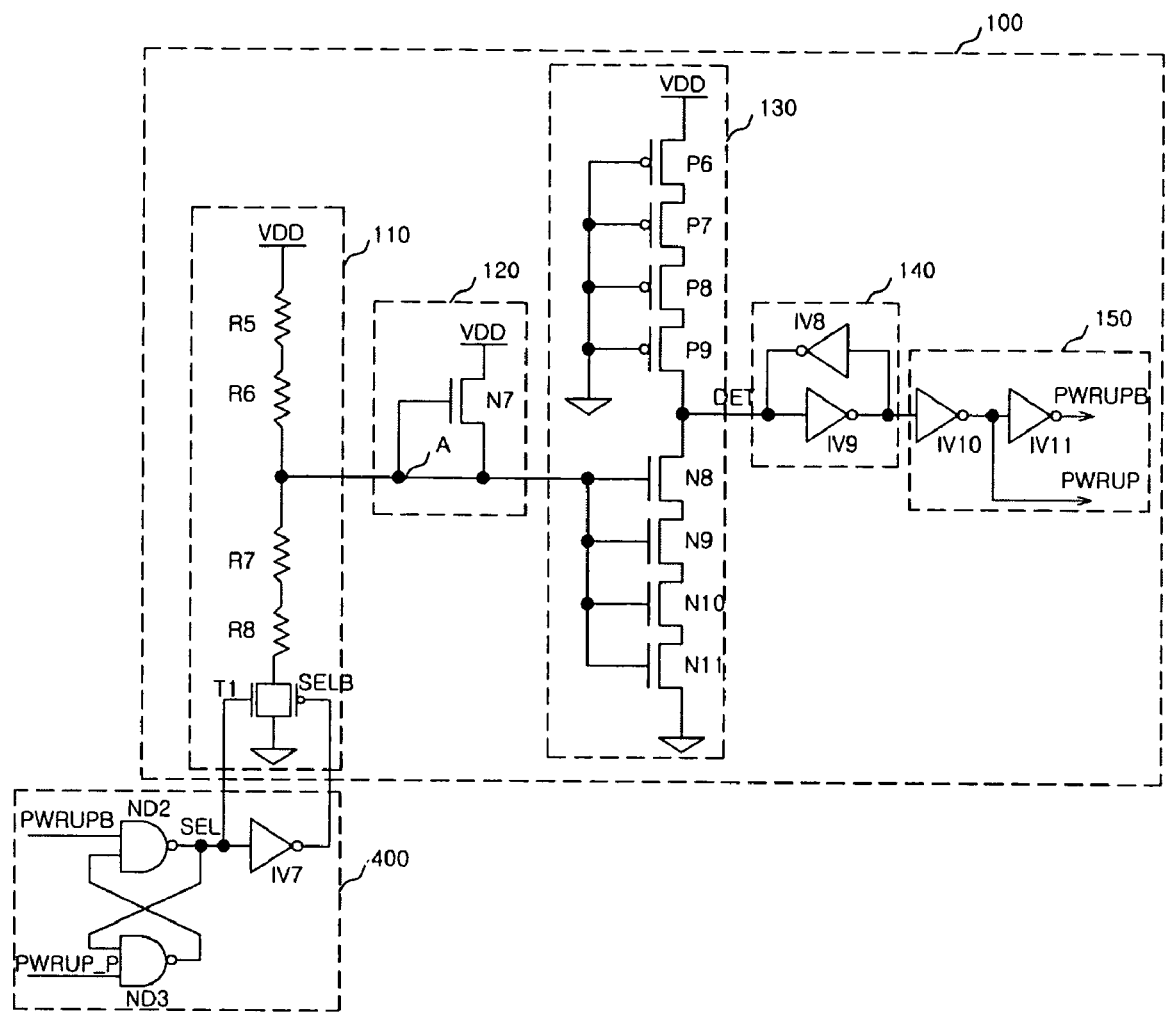
FIG. 8 is a detailed circuit diagram illustrating the power-up signal generating section and the power-up controlling section that are shown in FIG. 7.

FIG. 8 is a detailed circuit diagram illustrating the power-up signal generating section 100 and the power-up controlling section 400 that are shown in FIG. 7.

The power-up signal generating section 100 includes a voltage divider 110 that includes a switch to control the current path between the power source voltage VDD and the ground voltage VSS; a voltage supplier 120 connected to an output terminal of the voltage divider 110; a voltage detector 130 that detects a voltage taken at the output terminal of the voltage divider 110; a latch circuit 140 that holds a detection signal of the voltage detector 130; and a power-up signal output circuit 150 connected to an output terminal of the latch circuit 140.

The voltage divider 110 includes a plurality of resistors R5~R8, a transmission gate T1, and an inverter IV7. The plurality of resistors R5~R8 are connected between the external power source voltage VDD terminal and the transmission gate T1 in series. The transmission gate T1 is a kind of a controllable switch, selectively connecting the resistor R8 with the ground voltage VSS terminal by performing a selective switching operation in response to the selection signal SEL provided by the power-up controlling section 400 and an inverted selection signal SELB provided by the inverter IV7. While the controllable switch is formed of the transmission gate T1, it may be implemented in a single NMOS or PMOS transistor that is controllable. Meanwhile, as illustrated in FIG. 8, it is adapted to arrange the transmission gate T1 as the controllable switch.

The voltage supplier 120 includes an NMOS transistor N7 connected between the external power source voltage VDD terminal and a node A. The gate terminal of the NMOS transistor N7 is coupled to the node A. The voltage supplier 120 prevents a coupling effect on the node A that is the output terminal of the voltage divider 110.

The voltage detector 130 includes a plurality of PMOS transistors P6~P9 serially connected between the external power source voltage VDD terminal and the output terminal of the detection signal DET, and a plurality of NMOS transistors N8~N11 serially connected between the output terminal of the detection signal DET and the ground voltage VSS. The PMOS transistors P6~P9 maintain a normally turned-on state by the connection between their gate terminals and the ground voltage VSS terminal. The NMOS transistors N8~N11 respond to an output of the node A through their gate terminals, regulating the voltage level of the detection signal DET in accordance with the output of the node A.

Figure 10:
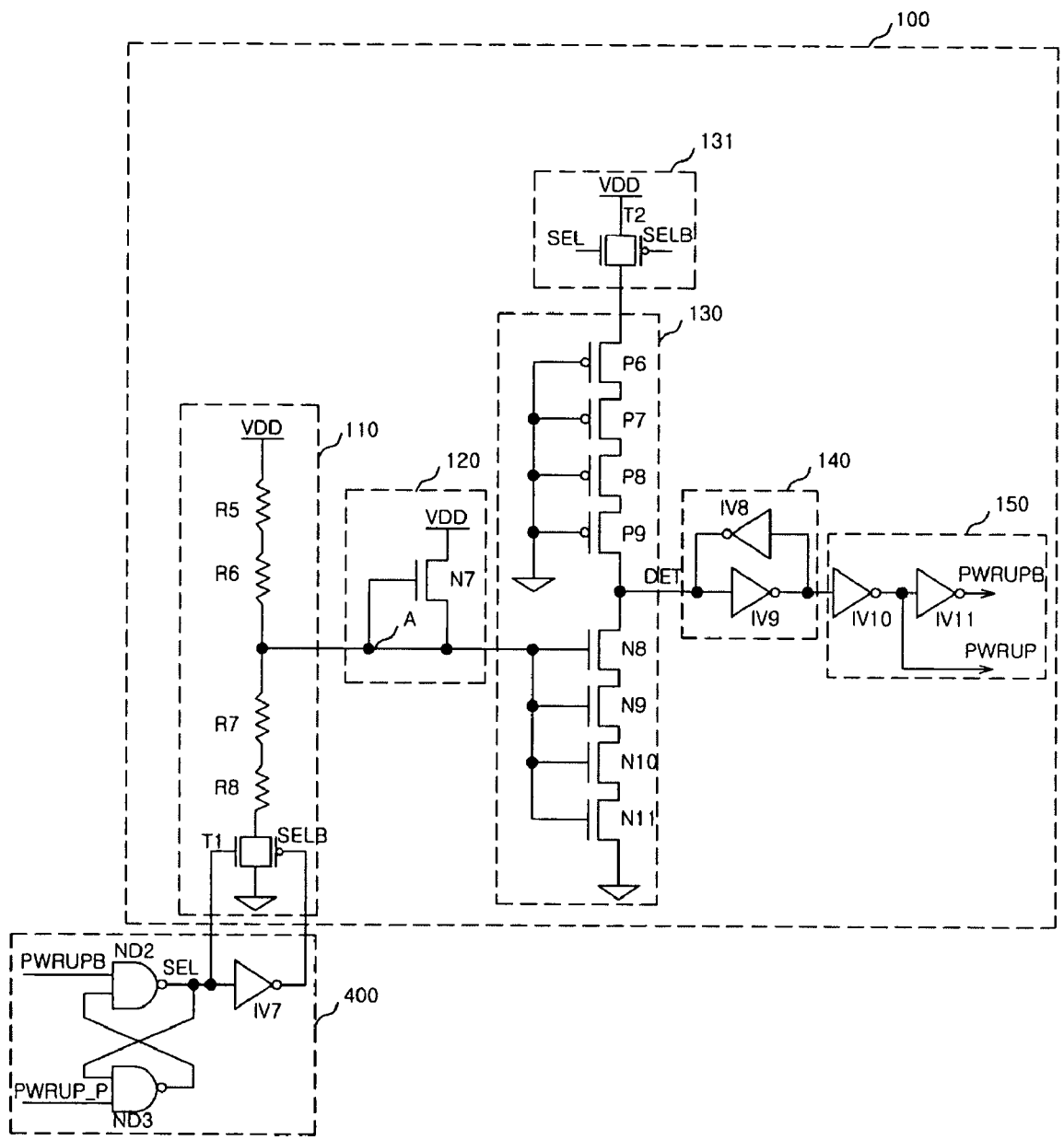
FIG. 10 is a circuit diagram illustrating another embodiment of the power-up signal generating section according to the present invention.

The latch circuit 140 includes inverters IV8 and IV9 and holds the detection signal DET for a predetermined time. The latch circuit 140 may be excluded in accordance with the drivability of the voltage detector 130, but it is adapted to be constructed as shown in FIG. 10.

The power-up signal output circuit 150 generates the power-up signal PWRUP by logically inverting an output of the latch circuit 140 through an inverter IV10, and it generates the power-up signal PWRUPB by logically inverting the power-up signal PWRUP through an inverter IV11.

The power-up controlling section 400 receives the power-up signal PWRUP and the inverted power-up signal PWRUPB, and includes NAND gates ND2 and ND3 and an inverter IV7 which are coupled with each other in a latch loop. The NAND gate ND2 outputs the selection signal SEL to the transmission gate T1 by conducting a NAND operation with the inverted power-up signal PWRUPB and an output of the NAND gate ND3. The NAND gate ND3 outputs a result to the NAND gate ND2 by conducting a NAND operation with the output of the NAND gate ND2 and the pulse PWRUP_P. The inverter IV7 outputs the inverted selection signal SELB from the selection signal SEL that is the output of the NAND gate ND2.

Now, the operation of the power-up circuit according to the present invention will be described, in conjunction with the timing diagram shown in FIG. 9.

First, the voltage divider 110 supplies the node A with a voltage divided from the external power source voltage VDD through the plurality of resistors R5~R8. An output of the node A is applied to the gate terminals of the NMOS transistors N7~N11 of the voltage detector 130 and then the detection signal DET is output through the drain terminal of the NMOS transistor N8.

As the voltage divider 110 is constructed to have a large resistance and small current, the amount of charge transferred to the node A through the voltage divider 110 may be sensitive to a coupling effect. Thus, the NMOS transistor N7 of the voltage supplier 120 contributes to preventing the coupling effect at the node A.

Next, the latch circuit 140 outputs the detection signal DET from its latching state. Through the power-up signal output circuit 150, the inverter IV10 outputs the inverted power-up signal PWRUPB by logically inverting an output of the latch circuit 140 and the inverter IV11 outputs the power-up signal PWRUP by logically inverting the power-up signal PWRUPB.

The pulse generating section 200 of FIG. 7 outputs the short pulse PWRUP_P to the initializing section 300 with reference to a time point at which the power-up signal PWRUP is supplied from the power-up signal generating section 100. The initializing section 300 begins to initialize internal circuits of the semiconductor memory apparatus in accordance with the power-up signal PWRUP provided from the power-up signal generating section 100 and the pulse PWRUP_P provided from the pulse generating section 200.

Before the short pulse PWRUP_P is output from the pulse generating section 200, the selection signal SEL is set to high level by the power-up controlling section 400. Namely, the pulse PWRUP_P is set to the level of the ground voltage VSS until the external power source voltage VDD reaches the target level. Thus, the transmission gate T1 of the voltage divider 110 is turned-on and the ground voltage VSS is normally supplied to the voltage divider 110.

Meanwhile, if the external power source voltage VDD is stabilized at the target level and the short pulse PWRUP_P is output from the pulse generating section 200, the selection signal SEL is set to low level by the power-up controlling section 400. Namely, if the external power source voltage VDD reaches the target level, the pulse PWRUP_P is activated with a short pulse.

Accordingly, the transmission gate T1 of the voltage divider 110 is turned off to interrupt the connection between the resistor R8 of the voltage divider 110 and the ground voltage VSS terminal. Thereby, after stabilization of the external power source voltage VDD, the ground voltage VSS terminal is disconnected from the voltage divider 110 and thereby a direct current path from the external power source voltage VDD terminal to the ground voltage VSS terminal is interrupted to reduce unnecessary power consumption.

Figure 9:
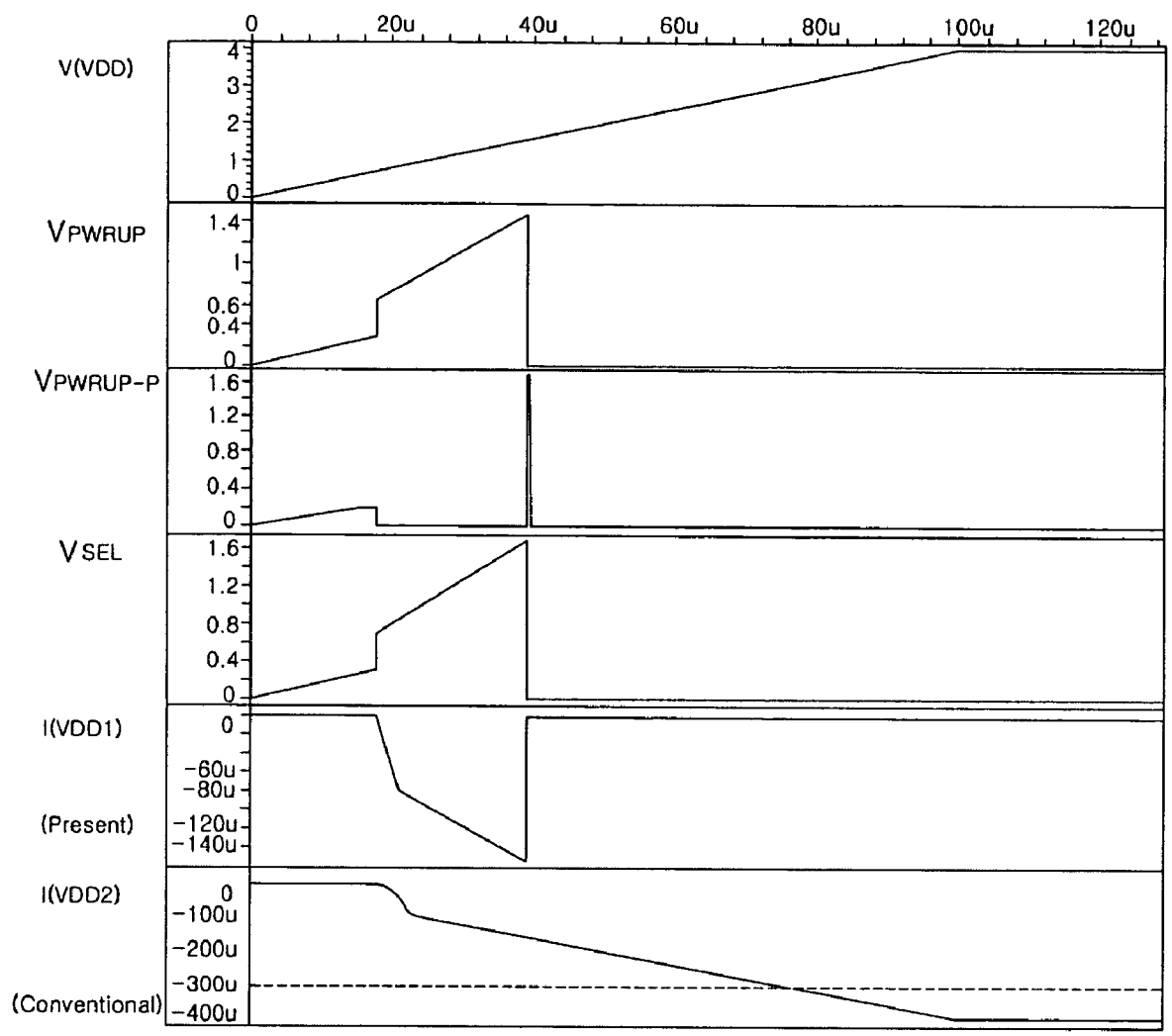
FIG. 9 is a graphic diagram comparing an embodiment of the present invention with the conventional case with regard to current consumption.

In detail, as shown in the simulation plots of FIG. 9, when the external power source voltage VDD rises up to 4V and the target voltage is designed to be about 1.2V, a conventional case continuously consumes current through the voltage divider even after stabilization of the external power source voltage VDD. But, embodiments of the present invention are able to cut off current dissipation through the voltage divider 110 after the external power source voltage VDD reaches the target level. This advantage over the conventional case is very helpful to a lower-power memory apparatus such as a memory for mobile use.

FIG. 10 is a circuit diagram illustrating another embodiment of the power-up signal generating section 100 according to the present invention.

The power-up signal generating section 100 of FIG. 10, relative to the structure shown in FIG. 8, further includes a switching circuit 131 in the voltage detector 130.

The switching circuit 131 includes a transmission gate T2 connected between the external power source voltage VDD terminal and the voltage detector 130. The transmission gate T2 selectively supplies the external power source voltage VDD to the voltage detector 130 in response to the selection signal SEL provided from the power-up controlling section 400. The transmission gate T2 may be formed of a single NMOS or PMOS transistor that is controllable, but it is adapted to construct the switching circuit 131 with the transmission gate as shown in FIG. 10.

In the structural feature shown in FIG. 10, when the voltage of the node A increases in the same manner as the external power source voltage VDD, a current flows by way of the serially connected PMOS and NMOS transistors P6~P9 and N8~N11. Although the serially connected PMOS and NMOS transistors P6~P9 and N8~N11 are operable with a small current and high resistance, it is even able to reduce consumption of a small current flowing through the voltage detector 130 after stabilization of the external power source voltage VDD by selectively supplying the external power source voltage VDD to the source terminal of the PMOS transistor P6 in accordance with a conductive state of the transmission gate T2.

Figure 11:
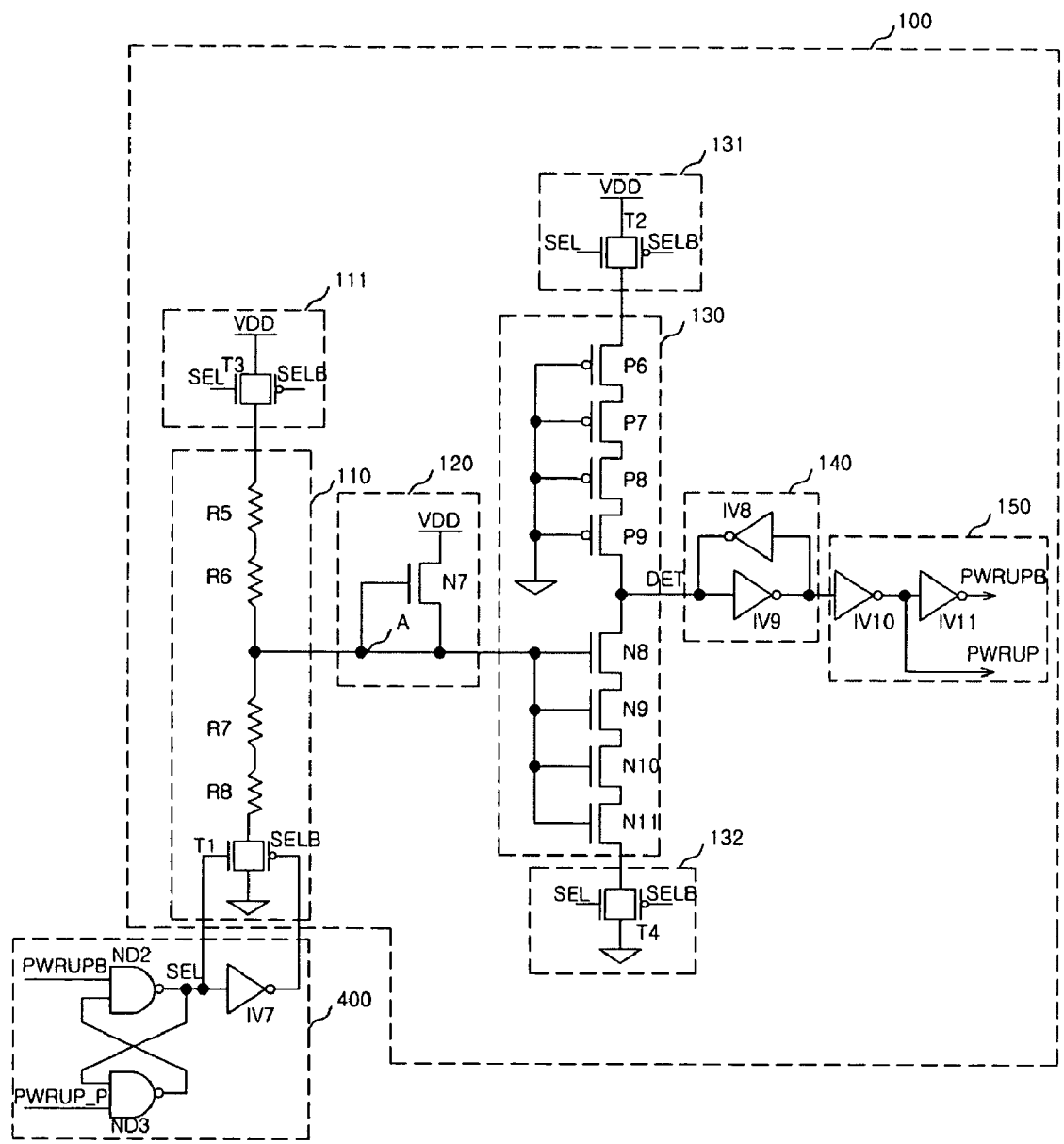
FIG. 11 is a circuit diagram illustrating still another embodiment of the power-up signal generating section according to the present invention.

FIG. 11 is a circuit diagram illustrating still another embodiment of the power-up signal generating section 100 according to the present invention.

The power-up signal generating section 100 of FIG. 11, relative to the structure shown in FIG. 10, further includes switching circuits 111 and 132.

The switching circuit 111 includes a transmission gate T3 connected between the external power source voltage VDD terminal and the voltage divider 110. The transmission gate T3 selectively supplies the external power source voltage VDD to the voltage divider 110 in response to the selection signal SEL provided from the power-up controlling section 400.

The switching circuit 132 includes a transmission gate T4 connected between the ground voltage VSS terminal and the voltage detector 130. The transmission gate T4 selectively connects the ground voltage VSS terminal with the voltage detector 130 in response to the selection signal SEL provided from the power-up controlling section 400.

In the structural feature shown in FIG. 11, when the voltage of the node A increases in the same manner as the external power source voltage VDD, a current flows by way of the serially connected PMOS and NMOS transistors P6~P9 and N8~N11. Although the serially connected PMOS and NMOS transistors P6~P9 and N8~N11 are operable with a small current and high resistance, it is even able to reduce consumption of a small current flowing through the voltage detector 130 after stabilization of the external power source voltage VDD by selectively supplying the ground voltage VSS to the source terminal of the NMOS transistor N11 in accordance with a conductive state of the transmission gate T4. Also, the supply of the external power source voltage VDD is interrupted to the voltage divider 110 after the external power source voltage VDD is stabilized on the target level. As a result, it is possible to reduce unnecessary current consumption by interrupting the direct current path from the external power source voltage VDD terminal toward the ground voltage VSS terminal.

On the other hand, the voltage divider 110 may include a controllable switch between the external power source voltage VDD terminal and the resistors, or include controllable switches interposed between the external power source voltage VDD terminal and the resistors, and between the resistors and the ground voltage VSS terminal.

As described above, embodiments of the present invention provide advantages as follows.

First, it is able to reduce unnecessary current consumption by interrupting a current path from a voltage source of the power-up signal generating section, after the external power source voltage is stabilized, during a power-up operation.

Second, reduction of current generated from the voltage source decreases the number of resistors used in the voltage divider. Thereby, it reduces the size of the power-up circuit, and the whole chip size as well.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A power-up circuit comprising:
   a power-up signal generating section connected to a terminal for an external source, configured to generate a power-up signal when the external source reaches a predetermined target level and to selectively interrupt a path from the terminal in response to a selection signal;
   a pulse generating section configured to generate a pulse with a predetermined pulse width to control an initializing operation based on an activation time of the power-up signal; and
   a power-up controlling section configured to provide the power-up signal generating section with the selection signal, variable by the pulse, when the power-up signal is active.

2. The power-up circuit as set forth in claim 1, wherein the power-up signal generating section is configured to interrupt an electrical connection with the terminal for the external source in accordance with activation of the selection signal when the external source reaches the predetermined target level.

3. The power-up circuit as set forth in claim 1, wherein the power-up signal generating section comprises:
   a first node having an output;
   a voltage divider configured to provide the first node with a voltage resistively divided from an external power source voltage and to selectively interrupt a connection to a ground voltage terminal in response to the selection signal;
   a voltage supplier configured to supply the external power source voltage to the first node in accordance with the output of the first node;
   a voltage detector configured to output a detection signal in response to the output of the first node;
   a latch circuit having an output configured to hold the detection signal of the voltage detector for a predetermined time; and
   a power-up signal output circuit configured to generate the power-up signal in response to the output of the latch circuit.

4. The power-up circuit as set forth in claim 3, wherein the voltage divider comprises:
   a plurality of resistors connected between a terminal for the external power source voltage and the ground voltage terminal; and
   a first switch configured to control the connection between the plurality of resistors and the ground voltage terminal in response to the selection signal.

5. The power-up circuit as set forth in claim 4, wherein the first switch comprises:
   a transmission gate configured to selectively control the connection between the plurality of resistors and the ground voltage terminal in response to the selection signal.

6. The power-up circuit as set forth in claim 4, wherein the voltage divider further comprises:
   a second switch configured to selectively control the connection between the terminal for the external power source voltage and the plurality of resistors in response to the selection signal.

7. The power-up circuit as set forth in claim 6, wherein the voltage detector comprises:
   an output terminal for outputting the detection signal;
   a plurality of PMOS transistors serially connected between the terminal for the external power source voltage and the output terminal for the detection signal and having a common gate terminal coupled to the ground voltage terminal; and
   a plurality of NMOS transistors serially connected between the output terminal for the detection signal and the ground voltage terminal and having a common gate terminal coupled to the output of the first node.

8. The power-up circuit as set forth in claim 7, wherein the voltage detector further comprises:
   a third switch configured to selectively control the connection between the terminal for the external power source voltage and the plurality of PMOS transistors in response to the selection signal.

9. The power-up circuit as set forth in claim 8, wherein the voltage detector further comprises:
   a fourth switch configured to selectively control the connection between the ground voltage terminal and the plurality of NMOS transistors in response to the selection signal.

10. The power-up circuit as set forth in claim 1, wherein the pulse is configured to toggle in response to activation of the power-up signal when the external power source voltage reaches the target level.

11. The power-up circuit as set forth in claim 1, wherein the power-up controlling section comprises a latch circuit.

12. The power-up circuit as set forth in claim 11, wherein the power-up controlling section comprises first and second NAND gates that form a latch loop configured to hold and output the selection signal in response to the power-up signal and the pulse.

13. The power-up circuit as set forth in claim 1, wherein the external source is an external power source voltage or a ground voltage.

14. A semiconductor memory apparatus with a power-up circuit comprising:
    a power-up signal generating section connected to a terminal for an external source, configured to generate a power-up signal when the external source reaches a predetermined target level and to selectively interrupt a path from the external source terminal in response to a selection signal;
    a pulse generating section configured to generate a pulse with a predetermined pulse width for controlling an initializing operation with reference to an activation time of the power-up signal;
    a power-up controlling section configured to provide the power-up signal generating section with the selection signal, variable by the pulse, when the power-up signal is active; and
    an initializing section configured to initialize circuits, in which PMOS and NMOS transistors are initialized at the same time, in response to the pulse.

15. The semiconductor memory apparatus as set forth in claim 14, wherein the power-up signal generating section is configured to interrupt an electrical connection with the terminal for the external source in accordance with activation of the selection signal when the external source reaches the target level.

16. The semiconductor memory apparatus as set forth in claim 14, wherein the power-up signal generating section comprises:
    a first node having an output; a voltage divider configured to provide the first node with a voltage resistively divided from an external power source voltage and to selectively interrupt an electrical connection to a ground voltage terminal in response to the selection signal;
    a voltage supplier configured to supply the external power source voltage to the first node in accordance with the output of the first node;
    a voltage detector configured to output a detection signal in response to the output of the first node;
    a latch circuit having an output configured to hold the detection signal of the voltage detector for a predetermined time; and
    a power-up signal output circuit configured to generate the power-up signal by logically inverting the output of the latch circuit and to generate an inverted power-up signal.

17. The semiconductor memory apparatus as set forth in claim 16, wherein the voltage divider comprises:
    a plurality of resistors connected between a terminal for the external power source voltage and the ground voltage terminal; and
    a first switch configured to control the connection between the plurality of resistors and the ground voltage terminal in response to the selection signal.

18. The semiconductor memory apparatus as set forth in claim 17, wherein the voltage divider further comprises:
    a second switch configured to selectively control the connection between the terminal for the external power source voltage and the plurality of resistors in response to the selection signal.

19. The semiconductor memory apparatus as set forth in claim 18, wherein the voltage detector further comprises:
    a third switch configured to selectively control the connection with the terminal for the external power source voltage in response to the selection signal; and
    a fourth switch configured to selectively control the connection with the ground voltage terminal in response to the selection signal.

20. The semiconductor memory apparatus as set forth in claim 14, wherein the power-up controlling section comprises a latch circuit.

21. The semiconductor memory apparatus as set forth in claim 14, wherein the external source is an external power source voltage or a ground voltage.

22. A power-up circuit comprising:
    a first node having an output;
    a voltage divider configured to provide the first node with a voltage resistively divided from an external power source voltage and to selectively interrupt an electrical connection to a ground voltage terminal in response to a selection signal;
    a voltage supplier configured to supply the external power source voltage to the first node in accordance with the output of the first node;
    a voltage detector configured to output a detection signal in response to the output of the first node; and
    a power-up signal output circuit configured to generate a power-up signal based on the detection signal.

23. The power-up circuit as set forth in claim 22, further comprising:
    a power-up controlling section configured to activate the selection signal in response to the power-up signal.

24. The power-up circuit as set forth in claim 23, further comprising:
    a latch circuit disposed between the voltage detector and the power-up signal output circuit, and configured to hold the detection signal from the voltage detector for a predetermined time.

25. The power-up circuit as set forth in claim 22, wherein the voltage divider comprises:
    a plurality of resistors connected between a terminal for the external power source voltage and the ground voltage terminal; and
    a first switch configured to control the connection between the plurality of resistors and the ground voltage terminal in response to the selection signal.

26. The power-up circuit as set forth in claim 25, wherein the first switch comprises:
    a transmission gate configured to selectively control the connection between the plurality of resistors and the ground voltage terminal in response to the selection signal.

27. The power-up circuit as set forth in claim 25, wherein the voltage detector comprises:
    an output terminal for the detection signal;
    a plurality of PMOS transistors serially connected between a terminal for the external power source voltage and the output terminal for the detection signal and having a common gate terminal coupled to the ground voltage terminal; and
    a plurality of NMOS transistors serially connected between the output terminal for the detection signal and the ground voltage terminal and having a common gate terminal coupled to the output of the first node.

28. The power-up circuit as set forth in claim 27, wherein the voltage detector further comprises:

a second switch configured to selectively control the connection between the terminal for the external power source voltage and the plurality of PMOS transistors in response to the selection signal.

29. The power-up circuit as set forth in claim 28, wherein the voltage detector further comprises:

a third switch configured to selectively control the connection between the ground voltage terminal and the plurality of NMOS transistors in response to the selection signal.

* * * * *